May 24, 1955 A. W. ZIEGLER 2,709,147

METHODS FOR BONDING SILICA BODIES

Filed Sept. 12, 1951 3 Sheets-Sheet 1

INVENTOR
A. W. ZIEGLER
BY
ATTORNEY

INVENTOR
A. W. ZIEGLER
BY
[signature]
ATTORNEY

May 24, 1955 A. W. ZIEGLER 2,709,147

METHODS FOR BONDING SILICA BODIES

Filed Sept. 12, 1951 3 Sheets-Sheet 3

INVENTOR
A. W. ZIEGLER
BY
ATTORNEY

United States Patent Office 2,709,147

Patented May 24, 1955

2,709,147

METHODS FOR BONDING SILICA BODIES

Arthur W. Ziegler, Short Hills, N. J., assignor to Bell Telephone Laboratories, Incorporated, New York, N. Y., a corporation of New York Application September 12, 1951, Serial No. 246,276

9 Claims. (Cl. 154—128)

This invention relates to the bonding of silica bodies and more particularly to a method of bonding a piezoelectric quartz crystal to a body of fused silica.

In certain ultrasonic devices, such as are disclosed in Patent No. 2,672,590 to H. J. McSkimin, one or more piezoelectric crystals are secured to a solid delay line, for example, of silica, in energy transmitting relation therewith. The operating characteristics of such devices are dependent markedly upon the character of the joint or bond between the crystals and the delay line. Bonds made in accordance with prior known methods are subject to one or more limitations such as, for example, to the completeness of the bond, restrictions on the band width over which uniform transmission is attained, particularly at frequencies of the order of 60 megacycles, and limits on the maximum permissible operating temperature.

One general object of this invention is to improve bonds between silica bodies. More specific objects of this invention are to increase the frequency band of uniform transmission between a quartz piezoelectric crystal and a vitreous silica delay line, to extend the temperature range of effectiveness of a quartz-vitreous silica bond, to enhance the uniformity of product of such bonds, and to simplify and facilitate the fabrication of bonds between silica bodies, suitable for the transmission of ultrasonic energy.

In one illustrative embodiment of this invention, coatings of indium are applied to one surface of each of a quartz crystal and a vitreous silica body and thereafter the coated surfaces are pressed against each other and the assembly is heated to effect bonding of the crystal and body. Advantageously, the coating thicknesses are such in accordance with the principles disclosed in the above-identified application as to provide a quarter wavelength impedance matching section at the bond between the crystal and body.

In accordance with features of this invention, the indium coatings are applied with the thickness controlled to a high degree of accuracy in a vacuum. The coated surfaces are then highly burnished and thereafter the crystal and body are mounted in an oven with the coated surfaces spaced from one another. The oven is evacuated and then these surfaces are moved into engagement and the assembly heated to bond the crystal and body together.

In applying the indium coatings to the silica bodies, apparatus is employed which eliminates to a high degree the possibility of variations in the amount of material deposited. This is accomplished by employing a gauging device which measures the amount of material deposited as the coating process progresses thereby eliminating the need to correlate the parameters of the process in estimating the amount of material being deposited.

The burnishings, and the evacuating of the oven while the coated surfaces are spaced and during the heating are of particular importance in the attainment of a highly completed bond, a bond having uniform transmission characteristics over a wide frequency band, and uniformity of product.

Heretofore attempts have been made to bond silica bodies utilizing metallic bonding media. These bonds have exhibited unsatisfactory characteristic for certain applications particularly those of the nature specifically disclosed here in that the completeness of the bond and the quality over the bonded area have not been as uniform as has been necessary for uniform signal transmission over wide band widths. It has been theorized that a principal problem in producing satisfactory bonds has been the existence of small pockets of air trapped between the surfaces to be joined, and, therefore, the avoidance of any trapped air between the surfaces has been sought in producing the bonds of this invention. Two principal methods of bringing the surfaces together without trapping air between them have been utilized. One is to make those surfaces very smooth, optically perfect if possible, and the other is to bring them together only after the air has been evacuated from between them. It has been found that particularly good bonds are produced economically by an expeditious combination of both of the above methods. Thus, although an optically flat surface might substantially eliminate the possibility of trapped gas and further provide a molecular attraction between the surfaces at all points over the bonding area, such a surface would require a series of expensive manufacturing operations. Something less than an optically perfect surface is employed in view of the above and the surfaces are joined only after a major portion of the air has been removed from between them, thus producing a completely satisfactory bond. In this combination of steps the quartz surfaces are initially polished to remove all major irregularities and, after the bonding material has been applied, a further smoothing of the mating surfaces is effected by burnishing the deposited material. The coated surfaces are brought together after the space between them has been evacuated and then the bonding coatings are fused. It has been found that a high percentage of bonds fabricated with the burnished surfaces have been satisfactory even though no further precautions were taken to avoid entrapped air and that a reasonably high percentage of satisfactory bonds are produced when no burnishing is employed and the surfaces are brought together in a vacuum. However, by far the best results are obtained when the surfaces are given the burnishing treatment noted above, then brought together in a vacuum and fused.

Although the following detailed description is in the main directed to a particular embodiment of this invention, it is to be understood that indium coating and bonding of silica bodies is applicable to other articles and forms of silica such as the application of electrodes to piezoelectric crystals wherein the electrode mass determines the crystal resonance frequency, and the fabrication of duplex quartz crystal units.

This invention is more fully described in the following detailed description referring to the accompanying drawings in which.

Figures 2, 3, 5:
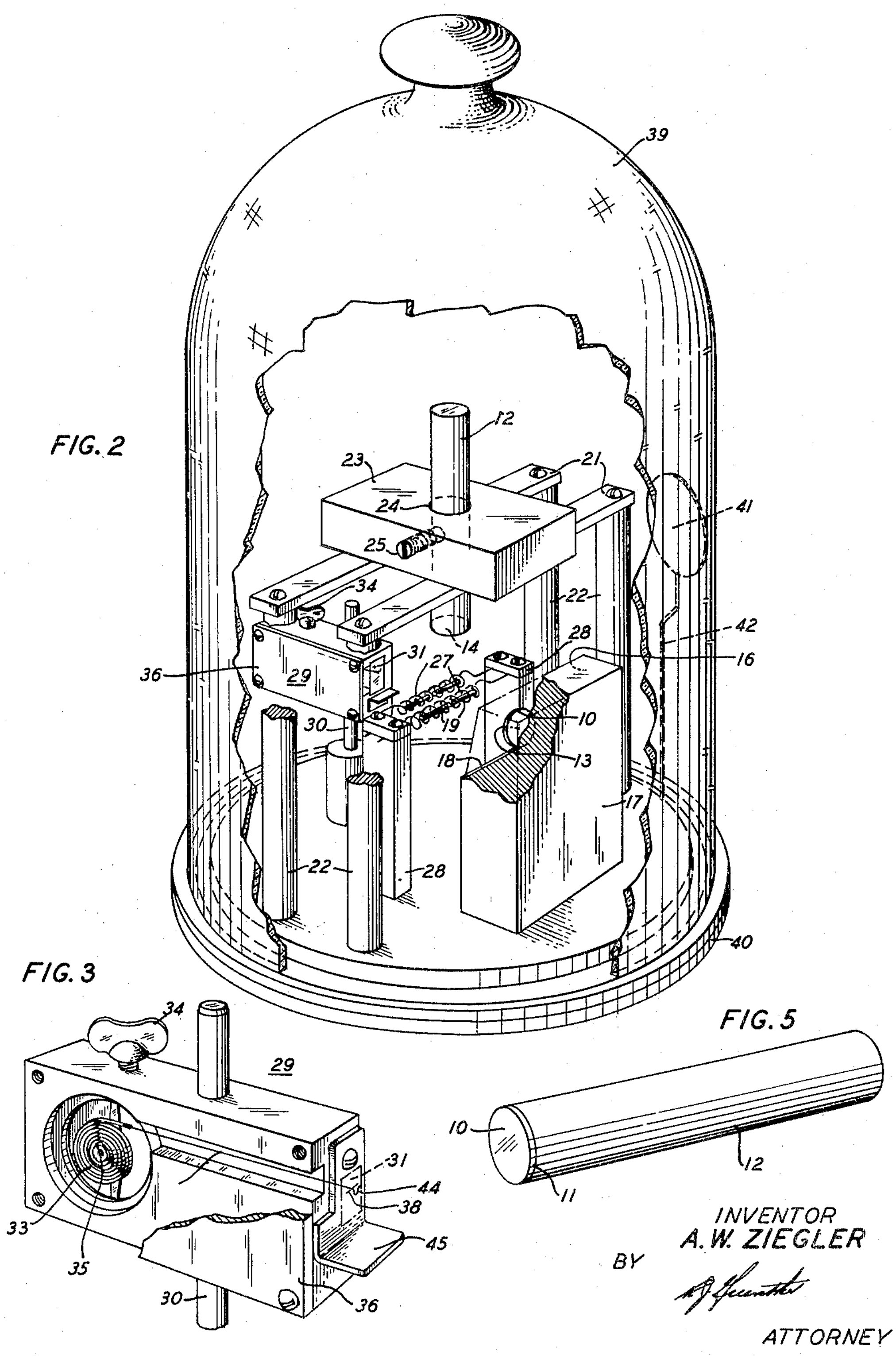
Fig. 2 is a perspective view of the apparatus for coating silica bodies with indium with portions thereof broken away to more clearly disclose the mounting of the elements to be coated and the deposition gauge.
Fig. 3 is a perspective view of the deposition gauge shown in Fig. 2 with a portion of its cover broken away to show the internal elements.
Fig. 5 is a perspective view of a partially assembled combination including a solid delay line and a quartz crystal bonded thereto.

In the structure shown in Fig. 5, a quartz crystal 10 is cut so that the proper mode of mechanical vibration is set up in a form which can be transmitted through a proper mechanical coupling 11 to a vitreous silica delay line 12 when the crystal is stressed electrically. The crystal is coupled to the delay line with a major surface 13 (see Fig. 2) bonded with an indium layer 11, having a thickness equal to one-quarter the mean wavelength which the apparatus is designed to transmit, to the end of the delay line 14.

Figure 1:
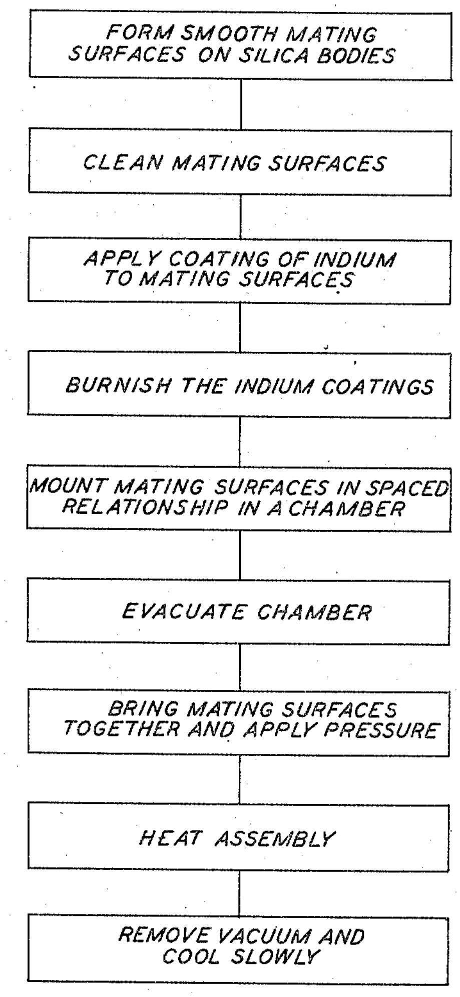
Fig. 1 is a flow chart depicting the operations applied to silica bodies in forming an indium bond between them.

As indicated in Fig. 1, the initial step in bonding the mating surfaces, crystal face 13 and delay line end 14, is that of forming smooth surfaces. This may be done in the case of the flat surfaces involved in the illustrative application by optical grinding and polishing techniques. An excellent bond can be established by making both surfaces flat to within .0001 inch. The quartz wafer 10 is mechanically polished with successive laps to a final lap providing a finish at least as fine as that produced by a 303½ emery in the usual soap solution. The vitreous silica rod 12 can be conveniently polished in a surface grinder initially employing a 200 grit diamond wheel with the final surface as highly polished as the wafer 10, this being achieved by finishing the surface with a 400 grit diamond wheel.

The mechanically polished surfaces are next cleaned by washing in a bath of hot chromic acid. If small fragments of quartz remain on the surfaces they can be removed conveniently by etching for two minutes in a commercial solution of 48 per cent hydrofluoric acid, or its equivalent, although it has been found that satisfactory bonds can be formed without this step. The cleaning of the polished surfaces is completed by giving them several rinses in hot distilled water and then rapidly drying them as by a filtered air blast or by centrifugation. These cleaned surfaces should be kept in containers which prevent contamination or the settling of dust particles thereon.

An accurate thickness of indium can be applied to the cleaned and polished silica surfaces by employing the apparatus disclosed in Figs. 2 and 3. The piezoelectric crystal 10 to be coated is mounted on the inclined face 16 of supporting block 17 so that it rests on the ledge 18 with its surface 13 normal to a radius from the axis of and a predetermined distance from a source 19 of indium vapor. The rod end 14 to be coated with indium is similarly situated relative to the indium vapor source by the supporting combination comprising the elevated cross members 21 on columns 22 which support the block 23 containing a suitable aperture 24 for the reception of the vitreous silica rod 12. The rod 12 is secured in the aperture 24 by friction through the gripping action of the set screw 25.

Indium vapor for the vapor deposition of coatings is produced by vaporizing substantially pure indium which is supported within tungsten heater coils 27. The tungsten heaters 27 employed in practicing one bonding operation according to this invention comprise twelve full turns of 0.030 inch diameter tungsten wires wound with ten turns to the inch over a .090 inch diameter mandrel. Two of these heaters are mounted on the columns 28 in insulating relationship, and suitable electrical connections (not shown) are provided so that they can be electrically heated separately.

The amount of material deposited by this process is gauged by the metering device 29 supported on column 30 which is shown in more detail in Fig. 3. This device includes a target 31 of known area which is positioned as the other surfaces being coated by this process, i. e., with its surface normal to a radius from the axis of the source of indium vapor and at a fixed distance, usually the same as the other surfaces, from the source. This target receives the metal vapor in the same manner and, if spaced the same distance, to the same degree as the other surfaces being coated since the vapor travels from the source in substantially straight lines. The target is positioned on the end of a cantilever 32 which in turn is supported on a spiral spring 33, so that as the coating is built up on it the target is displaced. The rotatable shaft 35 on which the spiral spring 33 is secured, permits calibration of the gauge 29 through the adjustment of the position of the cantilever arm 32 wherefrom its position is fixed by set screw 34. A knurled knob (not shown) is mounted on an extension of shaft 35 exterior of housing 36 to facilitate adjustment of cantilever 32.

In applying indium by vapor deposition, a relatively high vacuum is employed and hence the apparatus for deposition, as illustrated in Fig. 2, is housed in a bell jar 39 which can be sealed by conventional means to a suitable base 40. Since the density of coating which has been applied is determined by the displacement of the target 31 and since the coating material is deposited on the inner surface of the bell jar thereby obscuring any view of the target, a movable shield 41 has been provided adjacent the inner surface of the jar. This shield is supported on a flexible wand 42 and is of ferromagnetic material so that it can be moved aside by the influence of an external magnet to provide an unobstructed view of the target through a clean portion of the bell jar wall.

Since the particular application under consideration in the illustrative embodiment offered here requires a bond 11 of indium between the transducer or crystal wafer 10 and the delay line 12 which is one-quarter wavelength in thickness, the indium applied to each surface must be of a predetermined and accurately fixed thickness. Heretofore attempts to control the quantity of material deposited by vapor deposition techniques had been only moderately successful and had required extremely meticulous control of a large number of variables which are established by trial including relationship between source and surface, heater dimensions, weight of material initially employed, position of material in the evaporator, gas pressure, filament heating current, and filament glowing time. With the present apparatus, difficulties in control are substantially eliminated and the controls for the process have been materially simplified. These advantages have been obtained through the use of the deposition gauge 29. It is now possible to ascertain when a desired coating density has been deposited by direct observation. Thus the evaporation of material is carried on until the desired density is obtained and then stopped.

The gauging device is calibrated to a desired coating density by adjusting the shaft 35 so that the cantilever reaches a fixed position due to the effect of gravity on the target and the desired density of coating thereon. This is done by securing the target on the hook 44 on cantilever 32 with an added weight equal to that weight of indium to be deposited on the target area to produce the desired coating density and then adjusting the shaft position so that the target just touches stop 45 on the end of the gauge housing after which the added weight is removed.

Since indium vapor flows substantially radially from the source, the relative rate of deposition on various areas positioned normal to radii from the source vary inversely as the square of the lengths of said radii. The above is an approximation for large area plane surfaces of course but where the surfaces are perpendicular to radii at their centers and of relatively small dimensions the statement is accurate to a high degree. A high degree of accuracy is possible where the areas to be coated and the target area are of the same order of sizes and all areas are spaced from the source an equal distance. In one construction prepared according to this invention, each surface is coated with 20 milligrams of indium per square inch, when a ⅛ square inch target area is employed and is located the same distance from the source as the surfaces being plated and the gauge has been calibrated by hanging the target and a two and one-half milligram hair pin wire over the hook 44.

Considering now a typical indium coating operation in the apparatus of Fig. 2, initially and following each plating operating with the apparatus, the tungsten heaters are cleaned by glowing them in a vacuum at least as high as $5\times10^{-5}$ millimeters of mercury for a period of 5 to 10 seconds at 30 amperes. It has been found that excellent transmission characteristics at 60 megacycles result when the bond between the crystal 10 and delay line 12 is produced by coating each of the surfaces to be joined with from 20 to 24 milligrams of indium per square inch. A 20 milligram per square inch deposit is 8.5 microns thick while a 24 milligram per square inch layer is 10.2 microns thick. Two 17/32 inch lengths of .082 inch diameter indium wire of at least 99.96 per cent purity produced by extrusion from unlubricated dies are then mounted in each tungsten heater coil with their adjacent ends separated by about 0.1 inch. The vitreous silica rod 12 is secured in the block 23 and mounted on the cross bars 21 so that the face to be coated is two inches from the heaters and normal to a radiums therefrom. Quartz crystal wafer 10 is mounted on block 17 and spaced the same distance from the indium heaters as the rod end with its surface also normal to a radius from the source. Similarly, the gauge 29 is mounted on the base 40 so that the target surface is substantially vertical, normal to a radius from the heaters (this target orientation being assured by the cross bar 38 secured on cantilever 32 immediately adjacent hook 44) and the same distance therefrom as the rod end and wafers. All surfaces are positioned so that one heater will not mask the vapor of the other and none of the surfaces are located so that drops of indium might fall from the heater on them. Bell jar 39 is then placed on the base 40, sealed thereto, and evacuated to at least $2\times10^{-5}$ millimeters of mercury.

The indium is vaporized by glowing the heater coils separately. Initially 7 amperes are applied to one heater coil for a three minute period followed by a three minute period at 14 amperes, then three minutes at 18 amperes and finally 20 amperes are applied until all the indimum is evaporated from that heater. The apparatus is cooled for 15 minutes before the second heater is glowed following the same procedure as set forth above. Since the above parameters of this procedure result in the application of approximately 20 milligrams of indium per square inch when the surfaces to be coated are two inches from the indium source, it is necessary to observe the target position on gauge 29 only during the latter portion of the glowing cycle of the second heater. When the target is displaced to the stop 45, the current to the second heater is stopped and the parts are allowed to cool at least 30 minutes in the vacuum.

When the indium coatings are to be joined as shown in Fig. 5 they are maintained in the evacuated coating chamber until ready for the further steps of bonding to maintain a clean surface which is not oxidized or otherwise contaminated. Immediately after air is allowed to enter the coating chamber, the quartz and vitreous silica parts are removed and the indium plated surfaces burnished to exhibit a uniform bright polish. Excellent results have been obtained by burnishing with a clean, finely woven, nylon cloth such as nylon parachute cloth stretched over a flat polished steel plate with the cloth fibers aligned lengthwise and crosswise with respect to the burnishing direction. Burnishing requires only a few light strokes between the indium surface and the nylon cloth employing a back and forth motion, turning the part at the end of each stroke through about 90 degrees. In order to insure uniformity of each surface, flexing thereof and contact therewith by possible sources of contamination should be avoided throughout and any speck of dust or lint that may have settled must be removed.

Figure 4:
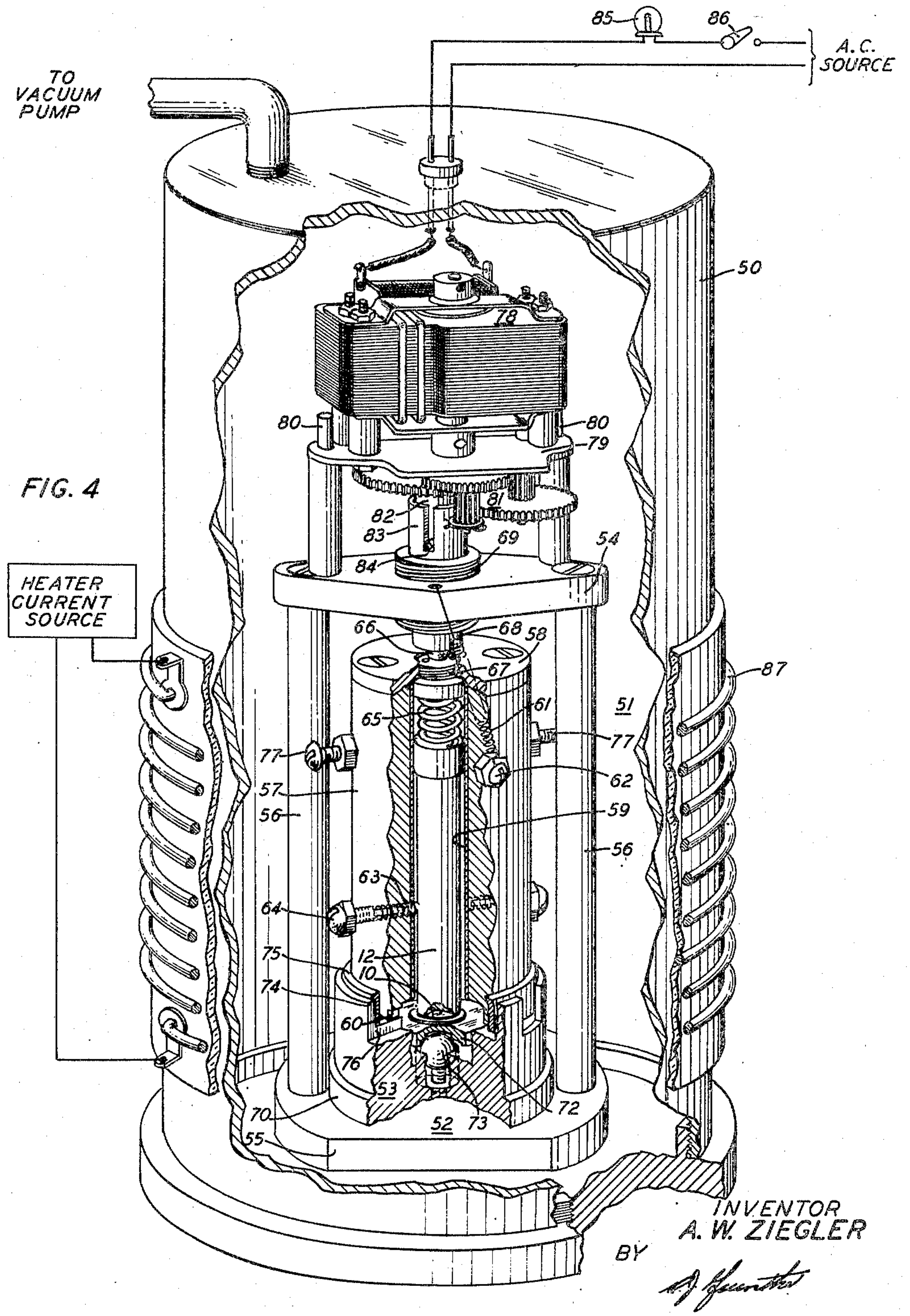
Fig. 4 is a perspective view of the apparatus employed in forming the indium bond between two prepared silica bodies with portions broken away to reveal details thereof.

The burnished parts are rapidly mounted in the apparatus shown in Fig. 4 without permitting the mating indium coated surfaces to contact, and the chamber, a vacuum oven 50, is evacuated to at least $2\times10^{-2}$ millimeters of mercury. After evacuation the indium surfaces are brought together with a pressure of about 250 pounds per square inch and baked in the vacuum oven 50 for 16 hours at a temperature of approximately 140° C. It has been found that a good bond is more consistently obtained when the elapsed time from the breaking of the vacuum in the bell jar 39 to the establishing of contact between the indium surfaces in the oven 50 does not exceed 30 minutes. After the baking period the fixture 51 and the quartz parts are removed from the vacuum oven and cooled slowly to at least 50° C. before the bonded parts are removed from the fixture. A cooling period of one hour is sufficient to avoid thermal strains in the silica members.

The fixture 51 for effecting the above steps in the bonding process comprises, as may be seen in Fig. 4, two sections, one in the form of a frame 52 supporting the vitreous silica delay line 12, and the other a base 53 fitting within the frame and supporting the crystal 10.

The frame 52 is made up of a pair of end members or platforms 54 and 55 joined together by the columns 56 positioned at diametrically opposed points on the peripheries of the end members. In order to maintain separation between the end 14 of rod 12 and the surface 13 on crystal 10 prior to evacuation and to establish contact between end 14 and surface 13 thereafter, rod 12 is mounted so that it can be moved after the oven is evacuated. This rod mount comprises a barrel 57 provided with a closed end 58 and a central aperture 59 extending along its axis through which rod 12 projects a fixed distance beyond the rim 60. The barrel 57 is suspended from the upper platform 54 of the frame 52 with the exposed end of the rod 12 projecting downward by a pair of springs 61 which are secured to the barrel at diametrically opposed points by screws 62. Rod 12 is maintained within the barrel by the frictional engagement of spring fingers 63 mounted on the ends of screws 64 so they can be advanced or retracted from the rod. The unexposed end of rod 12 abuts a coil spring 65 within the barrel which provides the pressure between the rod end 14 and crystal face 13 when the barrel is advanced toward the base 53. When the barrel 57 is suspended from platform 54 a steel ball 66 mounted in a socket 67 in end 58 fits into socket 68 on the end of lead screw 69 thereby aiding in establishing the proper seating of rod end 14 on surface 13 when they are brought into engagement.

Base section 53 comprises a cylindrical body portion 70 arranged to be positioned on platform 55 of the frame section 52 between columns 56. The upper surface of body portion 70 is hollowed and contains a flat polished steel table 72 on which the piezoelectric wafer 10 is mounted. This table 72 is balanced on a steel ball 73 to further assure an equalized pressure between the silica rod end 14 and wafer face 13 during the bonding cycle. A shoulder 74 surrounding and above the table 72 contains a centering ring 75 which engages the rim 60 of barrel 57 when it is advanced to limit its movement and guide the advancing barrel to insure proper mating of the surfaces to be joined. The bonding pressure is determined by the amount of compression built up in spring 65. This compression can be regulated by fixing the stiffness of spring 65 and the displacement of the rod in advancing the barrel rim 60 against an internal base shoulder 76, which in turn depends upon the length of rod which projects from the barrel when it contacts the spring 63 in its relaxed condition.

When the base 53 has been properly mounted with the crystal in position and the barrel supporting the rod has been suspended from the upper platform with its rim within the centering ring, the lead screw 69 threaded in platform 54 is turned to advance the rod end 14 to within about 1/16 inch of the crystal surface 13. Turning of the barrel during the operation of the lead screw is prevented by the screws 77 projecting therefrom and engaging columns 56. The assembled fixture 51 is then mounted in the vacuum oven 59 which is sealed and evacuated to at least $2 \times 10^{-2}$ millimeters of mercury. The surfaces to be joined are then brought together with the proper pressure for bonding by advancing the lead screw 69 by means of the electric motor 78 mounted by its mounting plate 79 on the pins 80 projecting from the upper surface of platform 54. Motor 78 through gear train 81 drives shaft 82 which is coupled to the split sleeve extension 83 on lead screw 69 by the transverse pin 84.

The motor 78 is controlled by the circuit schematically shown in Fig. 4 wherein the stalling of the motor by the engagement of rim 60 and shoulder 76 causes an increased current through lamp 85 and a brightening thereof to indicate that switch 86 should be opened.

As indicated above after the proper pressure has been established, the surfaces being bonded are baked as by passing current through the resistance windings 87 surrounding the oven 59 for a suitable time, then the vacuum is broken and the fixture and bonded silica pieces slowly cooled to 50° C.

It is to be understood that the above described arrangements are illustrative of the application of the principles of the invention. Numerous other arrangements and procedural variations particularly as to polishing and cleaning techniques and the bonding times, temperatures and pressures, which are interrelated, may be devised by those skilled in the art without departing from the spirit and scope of the invention.

What is claimed is:

1. The method of bonding silica bodies together which comprises forming smooth mating surfaces on each of said bodies, applying a coating of indium to the smooth surfaces, burnishing the indium coatings, placing the coated surfaces in face to face engagement in an evacuated chamber, and heating the body and member.

2. The method of bonding silica bodies together which comprises forming smooth mating surfaces on each of said bodies, applying a coating of indium to the smooth surfaces, burnishing the indium coatings, mounting said bodies in spaced relation in a chamber, evacuating the chamber, moving said bodies to place the coated surfaces in face to face engagement, and heating the body and member.

3. The method of bonding a quartz member to a vitreous silica body which comprises, forming a smooth surface on each of said member and said body, depositing a layer of indium on each of said surfaces in a vacuum, burnishing the coated surface, mounting said member and said body with said surfaces in spaced relation in a chamber, evacuating said chamber within 30 minutes of the time said body and said member were removed from the vacuum in which said surfaces were coated, moving said member and said body to place the coated surfaces in face to face engagement, and heating the coated surfaces to bond the coatings thereon together.

4. The method of bonding a quartz member to a vitreous silica body which comprises, forming a smooth surface on each of said member and said body, depositing a layer of indium on each of said surfaces in a vacuum, burnishing the coated surfaces, mounting said member and said body with said surfaces in spaced relation in a chamber, evacuating said chamber within 30 minutes of the time said body and said member were removed from the vacuum in which said surfaces were coated, moving said member and said body to place the coated surfaces in face to face engagement, applying about 250 pounds per square inch pressure between said member and said body, and heating the coated surfaces to about 140° C.

5. The method of bonding a quartz member to a vitreous silica body which comprises, forming a smooth surface on each of said member and said body, depositing a layer of indium on each of said surfaces in a vacuum, burnishing the coated surfaces, mounting said member and said body with said surfaces in spaced relation in a chamber, evacuating said chamber within 30 minutes of the time said body and said member were removed from the vacuum in which said surfaces were coated, moving said member and said body to place the coated surfaces in face to face engagement, applying about 250 pounds per square inch pressure between said member and said body, heating the coated surfaces at about 140° C. for about 16 hours, and slowly cooling said member and said body to at least 50° C.

6. The method of producing a quarter wavelength bond between a quartz piezoelectric crystal and a vitreous silica delay line operating at frequencies of about 60 megacycles which comprises forming a smooth flat surface on each of said crystals and said line having a flatness of at least .0001 inch, by mechanical polishing, etching the flat surfaces in a hot chromic acid bath, rinsing said surfaces in hot distilled water, drying said surfaces, vapor depositing a 22 milligrams per square inch layer of indium on each of said surfaces in a vacuum, burnishing said coated surfaces with nylon cloth, mounting said crystal and said line in spaced relation in a chamber, evacuating said chamber containing said crystal and said line within 30 minutes of the time they were removed from the first vacuum, moving said crystal and said line to place the coated surface in face to face engagement, applying about 250 pounds per square inch pressure between said crystal and said line, heating the crystal and line at about 140° C. for about 16 hours, and slowly cooling the crystal and line to at least 50° C.

7. The method of bonding silica bodies comprising forming smooth mating surfaces on a pair of silica bodies, cleaning the mating surfaces, positioning the silica bodies with the mating surfaces in spaced relationship, initiating the deposit of indium upon the exposed mating surfaces of the silica bodies, measuring the quantity of indium depisited upon a member adjacent the mating surfaces, terminating the deposit of indium when the deposit upon the member corresponds to the desired coating thickness upon the mating surfaces, burnishing the indium coated mating surfaces, introducing the silica bodies into a container, evacuating the container, engaging the mating surfaces under pressure, heating the assembly to a temperature of approximately 140 degrees centigrade, removing the vacuum, and cooling the assembly.

8. The method of bonding silica bodies comprising forming a smooth mating surface on each of a pair of silica bodies, cleaning the mating surfaces, mounting each of the bodies with the mating surfaces in spaced relationship within a container, evacuating the container, vaporizing indium in the region between the mating surfaces, weighing the amount of indium deposited upon a surface of a member mounted at a predetermined distance from said mating surfaces, terminating the vaporization when the increase in weight of the member corresponds to the desired coating thickness on the silica members, removing the silica bodies from the container, burnishing the mating surfaces, bringing the mating surfaces together under mechanical pressure in a vacuum, heating the silica bodies to approximately 140 degrees for about 16 hours and cooling the assembled bodies.

9. The method of bonding silica bodies with an indium bond comprising placing a pair of silica bodies in a container with a smooth clean mating surface of each body in spaced relationship, placing a resiliently mounted member adjacent the mating surfaces, initiating the vaporization of indium in the region adjacent said mating surfaces and resiliently mounted member, terminating the vaporization of indium when said member is gravitationally displaced an amount corresponding to the desired coating thickness on the silica bodies, removing the silica bodies from the container, burnishing the mating surfaces, engaging the surfaces under a mechanical pressure of approximately 250 pounds per square inch in a vacuum, heating the bodies to a temperature of 140 degrees centigrade for approximately 16 hours, removing the vacuum and slowly cooling the bodies.

References Cited in the file of this patent

UNITED STATES PATENTS

| | | |
|---|---|---|
| 1,717,712 | Loewe | June 18, 1929 |
| 1,812,937 | Dollack | July 7, 1931 |
| 1,969,632 | Varney | Aug. 7, 1934 |
| 1,970,328 | MacIldowie | Aug. 14, 1934 |
| 2,143,723 | Walker et al. | Jan. 10, 1939 |
| 2,383,469 | Colbert | Aug. 28, 1945 |
| 2,576,073 | Kropa et al. | Nov. 20, 1951 |

FOREIGN PATENTS

| | | |
|---|---|---|
| 577,948 | Great Britain | of 1946 |
| 625,371 | Great Britain | of 1949 |
| 661,690 | Great Britain | of 1951 |

OTHER REFERENCES

Indium Surface-Alloys, pp. 630–633, of Product Engineering, October 1943.